(12) United States Patent
Kelman et al.

(10) Patent No.: US 8,138,070 B2
(45) Date of Patent: Mar. 20, 2012

(54) METHODS OF USING A SET OF SILICON NANOPARTICLE FLUIDS TO CONTROL IN SITU A SET OF DOPANT DIFFUSION PROFILES

(75) Inventors: Maxim Kelman, Mountain View, CA (US); Michael Burrows, Cupertino, CA (US); Dmitry Poplavskyy, San Jose, CA (US); Giuseppe Scardera, Sunnyvale, CA (US); Daniel Kray, Freiburg (DE); Elena Rogojina, Los Altos, CA (US)

(73) Assignee: Innovalight, Inc., Sunnyvale, CA (US)

( * ) Notice: Subject to any disclaimer, the term of this patent is extended or adjusted under 35 U.S.C. 154(b) by 0 days.

(21) Appl. No.: 12/626,198

(22) Filed: Nov. 25, 2009

(65) Prior Publication Data

US 2010/0167510 A1 Jul. 1, 2010

Related U.S. Application Data

(60) Provisional application No. 61/222,628, filed on Jul. 2, 2009.

(51) Int. Cl.
*H01L 21/04* (2006.01)

(52) U.S. Cl. ........ 438/510; 438/513; 438/663; 438/752; 257/E21.042; 257/E21.077; 257/E21.092; 257/E21.227; 257/E21.267; 257/E21.278; 257/E21.293; 257/E21.311

(58) Field of Classification Search .................. 438/311, 438/501, 504, 505, 508, 509, 510, 613, 542, 438/558, 663, 723, 724, 752; 257/E21.042, 257/E21.077, E21.092, E21.227, E21.267, 257/E21.278, E21.293, E21.311
See application file for complete search history.

(56) References Cited

U.S. PATENT DOCUMENTS 4,068,018 A 1/1978 Hashimoto et al.
5,656,556 A 8/1997 Yang
(Continued)

OTHER PUBLICATIONS

U.S. Appl. No. 12/692,878, filed Jan. 25, 2010, Scardera et al.
(Continued)

*Primary Examiner* — David Nhu
(74) *Attorney, Agent, or Firm* — Foley & Lardner LLP

(57) ABSTRACT

A method of forming a multi-doped junction is disclosed. The method includes providing a first substrate and a second substrate. The method also includes depositing a first ink on a first surface of each of the first substrate and the second substrate, the first ink containing a first set of nanoparticles and a first set of solvents, the first set of nanoparticles containing a first concentration of a first dopant. The method further includes depositing a second ink on a second surface of each of the first substrate and the second substrate, the second ink containing a second set of nanoparticles and a second set of solvents, the second set of nanoparticles containing a second concentration of a second dopant. The method also includes placing the first substrate and the second substrate in a back to back configuration; and heating the first substrate and the second substrate in a first drive-in ambient to a first temperature and for a first time period. The method further includes exposing the first substrate and the second substrate in the back to back configuration to a deposition ambient, the deposition ambient containing $POCl_3$, a carrier $N_2$ gas, a main $N_2$ gas, and a reactive $O_2$ gas for a second time period; and heating the first substrate and the second substrate in a second drive-in ambient to a third temperature for a third time period.

18 Claims, 10 Drawing Sheets

U.S. PATENT DOCUMENTS

| | | | |
|---|---|---|---|
| 6,130,380 | A | 10/2000 | Nakamura |
| 6,171,975 | B1 | 1/2001 | Hase et al. |
| 6,461,901 | B1 | 10/2002 | Noguchi |
| 7,135,350 | B1 * | 11/2006 | Smith et al. ............ 438/48 |
| 7,192,873 | B1 * | 3/2007 | Kim et al. ............ 438/702 |
| 7,355,238 | B2 * | 4/2008 | Takata et al. ............ 257/314 |
| 7,411,255 | B2 * | 8/2008 | Parekh et al. ............ 257/390 |
| 7,615,393 | B1 | 11/2009 | Shah et al. |
| 2003/0134469 | A1 | 7/2003 | Horzel et al. |
| 2005/0176164 | A1 | 8/2005 | Gee et al. |
| 2006/0096635 | A1 | 5/2006 | Tuttle |
| 2006/0211187 | A1 | 9/2006 | Choi et al. |
| 2007/0246689 | A1 | 10/2007 | Ge et al. |
| 2008/0111206 | A1 | 5/2008 | Hanoka et al. |
| 2008/0138966 | A1 | 6/2008 | Rogojina et al. |
| 2008/0146005 | A1 | 6/2008 | Lemmi et al. |
| 2008/0160265 | A1 * | 7/2008 | Hieslmair et al. ............ 428/208 |
| 2008/0182390 | A1 | 7/2008 | Lemmi et al. |
| 2008/0302660 | A1 | 12/2008 | Kahn et al. |
| 2009/0017606 | A1 | 1/2009 | Fath et al. |
| 2009/0020158 | A1 | 1/2009 | Ohtsuka et al. |
| 2009/0239330 | A1 | 9/2009 | Vanheusden et al. |
| 2009/0239363 | A1 | 9/2009 | Leung et al. |
| 2009/0269913 | A1 | 10/2009 | Terry et al. |
| 2010/0015749 | A1 | 1/2010 | Borden |

OTHER PUBLICATIONS

U.S. Appl. No. 12/656,710, filed Feb. 12, 2010, Scardera et al.

Bentzen et al., "Understanding phosphorus emitter diffusion in silicon solar cell processing," Proceedings of the 21$^{st}$ European Photovoltaic Solar Energy Conference, Dresden, Germany, 2006, 1388-1391.

Bultman et al., Ideal Single Diffusion Step Selective Emitters: A Comparison Between Theory and Practice, European Photovoltaic Solar Energy Conference and Exhibition, Munich, 2001, 6 pages.

Drabczyk et al., The influence of porous silicon on junction formation in silicon solar cells, *Solar Energy Materials & Solar Cells*, 2003, 76:545-551.

González-Díaz et al., Low-porosity porous silicon nanostructures on monocrystalline silicon solar cells, Physica E, 2007, 38:215-218.

Jones, Scotten W., Diffusion in Silicon, IC Knowledge LLC, 2000, 71 pages.

Moon et al., Selective emitter using porous silicon for crystalline silicon solar cells, *Solar Energy Materials & Solar Cells*, 2008, 5 pages.

Voyer et al., "Progress in the Use of Sprayed Phosphoric Acid as an Inexpensive Dopant Source for Industrial Solar Cells," 20$^{th}$ European Photovoltaic Solar Energy Conference, Jun. 2005, 4 pages.

International Search Report and Written Opinion mailed Sep. 2, 2010, in PCT/US2010/040623, 10 pages.

International Search Report and Written Opinion mailed May 27, 2011, in PCT/US2011/22377, 13 pages.

International Search Report and Written Opinion dated Jan. 27, 2011, in corresponding PCT/US2010/057782, 14 pages.

International Search Report and Written Opinion dated Mar. 18, 2011, in PCT/US2011/022107, 8 pages.

International Search Report and Written Opinion mailed Sep. 16, 2011, in PCT/US2011/038359, 14 pages.

U.S. Appl. No. 12/506,811, filed Jul. 21, 2009, Scardera et al.
U.S. Appl. No. 12/794,188, filed Jun. 4, 2010, Scardera et al.
U.S. Appl. No. 13/099,794, filed May 3, 2011, Kelman et al.
U.S. Appl. No. 13/172,040, filed Jun. 29, 2011, Abbott et al.

International Search Report and Written Opinion dated Oct. 21, 2011, in PCT/US2011/042330, 9 pages.

Altermatt et al., "Rear surface passivation of high-efficiency silicon solar cells by a floating junction," J. Appl. Phys., Sep. 15, 1996, 80(6):3574-3586.

Blakers et al., "22.8% efficient silicon solar cell," Appl. Phys. Lett., Sep. 25, 1989, 55(13):1363-1365.

Dauwe et al., "Experimental Evidence of Parasitic Shunting in Silicon Nitride Rear Surface Passivated Solar Cells," Progress in Photovoltaics: Research and Applications, 2002, 10:271-278.

Honsberg et al., "685 mV Open-circuit voltage laser grooved silicon solar cell," Solar Energy Materials and Solar Cells, 1994, 34:117-123.

Hubbard et al., "Thermodynamic stability of binary oxides in contact with silicon," J. Mater. Res., Nov. 1996, 11(11):2757-2776.

Trupke et al., "Photoluminescence imaging of silicon wafers," Applied Physics Letters, 2006, 89:044107-1 to 044107-3.

Wang et al., "24% efficient silicon solar cells," Appl. Phys. Lett., Aug. 6, 1990, 57(6):602-604.

* cited by examiner

METHODS OF USING A SET OF SILICON NANOPARTICLE FLUIDS TO CONTROL IN SITU A SET OF DOPANT DIFFUSION PROFILES

CROSS-REFERENCE TO RELATED APPLICATIONS

This application claims the benefit of U.S. Patent No. 61/222,628 filed Jul. 2, 2009, entitled Methods of Using A Silicon Nanoparticle Fluid To Control In Situ A Set Of Dopant Diffusion Profiles, the entire disclosure of which is incorporated by reference.

FIELD OF DISCLOSURE

This disclosure relates in general to p-n junctions and in particular to methods of using a set of silicon nanoparticle fluids to control in situ a set of dopant diffusion profiles.

BACKGROUND

A solar cell converts solar energy directly to DC electric energy. Generally configured as a photodiode, a solar cell permits light to penetrate into the vicinity of metal contacts such that a generated charge carrier, such as an electron or a hole (a lack of an electron), may be extracted as current. Like most other diodes, a photodiodes is formed by combining p-type and n-type semiconductors to form a junction.

Electrons on the p-type side of the junction within the electric field (or built-in potential) may then be attracted to the n-type region (usually doped with phosphorous) and repelled from the p-type region (usually doped with boron), whereas holes within the electric field on the n-type side of the junction may then be attracted to the p-type region and repelled from the n-type region. Generally, the n-type region and/or the p-type region can each respectively be comprised of varying levels of relative dopant concentration, often shown as n−, n+, n++, p−, p+, p++, etc. The built-in potential and thus magnitude of electric field generally depend on the level of doping between two adjacent layers.

Substantially affecting solar cell performance, carrier lifetime (or recombination lifetime) is defined as the average time it takes an excess minority carrier (non-dominant current carrier in a semiconductor region) to recombine and thus become unavailable to conduct an electrical current. Likewise, diffusion length is the average distance that a charge carrier travels before it recombines. In general, although increasing dopant concentration improves conductivity, it also tends to increase recombination. Consequently, the shorter the recombination lifetime or recombination length, the closer the metal region must be to where the charge carrier was generated.

A conventional solar cell is generally configured with a set of front and a rear metal contacts on a silicon substrate doped with a first dopant (commonly boron) forming an absorber region, upon which a second counter dopant (commonly phosphorous), is diffused forming the emitter region, in order to complete the p-n junction. After the addition of passivation and antireflection coatings, the metal contacts (fingers and busbar on the emitter and pads on the back of the absorber) may be added in order to extract generated charge.

In an alternative rear-contact solar cell configuration, all the metal contacts are positioned in an inter-digitated manner on the rear of a doped substrate. That is, interweaving alternating n-type regions and p-type regions.

In general, a low concentration of (substitutional) dopant atoms within a doped region will result in both low recombination (thus higher solar cell efficiencies) and in poor electrical contact to metal electrodes. Conversely, a high concentration of (substitutional) dopant atoms will result in both high recombination (thus reducing solar cell efficiency), and a low resistance ohmic contacts to metal electrodes. Often, in order to reduce manufacturing costs, a single (suboptimal) dopant diffusion is generally used to form an emitter, with a doping concentration selected as a compromise between low recombination and low resistance ohmic contact. Consequently, the resulting solar cell efficiency (the percentage of sunlight that is converted to electricity) is reduced.

Also affecting efficiency is the presence of a BSF (back surface field) in the case of a conventional solar cell configuration, or a FSF (front surface field) in the case of a rear contact solar cell configuration. A surface field is configured to help minimize charge carrier recombination by creating a field that repels minority carriers both from surface regions and from metalized regions on the surfaces. Formed using dopants of the same type as those used in the absorber region, the concentration of dopant atoms in a surface field is generally selected to be higher than that used to dope the absorber region.

In the case of a BSF, because aluminum is often used, the resulting electrical conductivity and electric field characteristics (i.e., field strength and field uniformity) for repelling minority carriers of the BSF may be suboptimal for use in a high efficiency (i.e., >17%) solar cells. Typically, aluminum is applied via screen deposition onto the back of a solar cell, and then co-fired in a belt furnace along with the front side metal contacts (commonly formed from screen printed silver paste). Aluminum atoms (with a substantially lower melting temperature than silicon) tend to diffuse into the silicon substrate and become incorporated into the silicon crystal. However, the thermal expansion coefficient of aluminum $\alpha$ of about $25 \times 10^6$ ($1/^\circ$ C.) is approximately 10 times larger than that of silicon, which in turn may cause significant substrate bow as a result of the firing process. That is, as the substrate thickness decreases and the aluminum thickness increases, the amount of substrate bow will increase making the substrates unsuitable for module construction.

Furthermore, an aluminum BSF may also tend to contribute to solar cell efficiency losses, since any light photon that is transmitted through the wafer and is absorbed by aluminum is unavailable for charge carrier generation.

In view of the foregoing, there is a desire to provide a method of using a set of silicon nanoparticle fluids to control in situ both front surface and rear surface dopant diffusion profiles.

SUMMARY

The invention relates, in one embodiment, to a method of forming a multi-doped junction is disclosed. The method includes providing a first substrate and a second substrate. The method also includes depositing a first ink on a first surface of each of the first substrate and the second substrate, the first ink comprising a first set of nanoparticles and a first set of solvents, the first set of nanoparticles comprising a first concentration of a first dopant. The method further includes depositing a second ink on a second surface of each of the first substrate and the second substrate, the second ink comprising a second set of nanoparticles and a second set of solvents, the second set of nanoparticles comprising a second concentration of a second dopant. The method also includes placing the first substrate and the second substrate in a back to back configuration; and heating the first substrate and the second substrate in a first drive-in ambient to a first temperature and for a first time period. The method further includes exposing the first substrate and the second substrate in the back to back configuration to a deposition ambient, the deposition ambient comprising $POCl_3$, a carrier $N_2$ gas, a main $N_2$ gas, and a reactive $O_2$ gas for a second time period; and heating the first substrate and the second substrate in a second drive-in ambient to a third temperature for a third time period.

DETAILED DESCRIPTION

Figure 1:
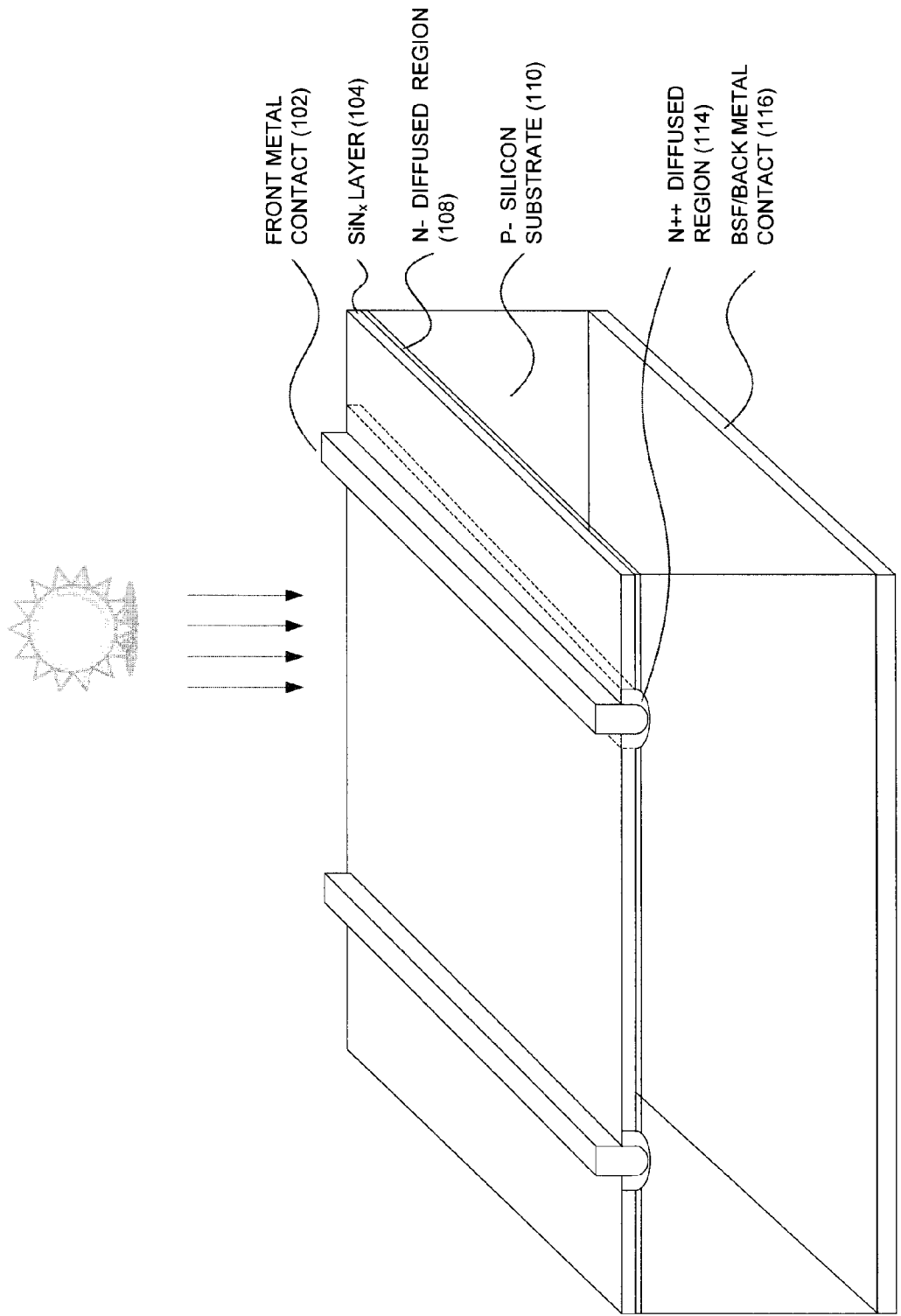
FIG. 1 shows a simplified diagram of a solar cell with a selective emitter and blanket BSF.

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

In general, in order to form a multi-doped junction in a conventional solar cell configuration, such as a selective emitter, a combination of gases and a masking step are often used to deposit dopants on a Group IV substrate. That is, a mask is first deposited on the Group IV (e.g., silicon, etc.) substrate in which areas that are to be highly doped are exposed after which the Group IV substrate is exposed to a first dopant gas. The mask is then removed, and the Group IV substrate is then exposed to a second lower concentration dopant gas (or a dopant gas at the same concentration but lower temperature), thus creating a selective emitter configuration. For example, in order to diffuse phosphorous into a boron doped silicon substrate, $POCl_3$ (phosphorus oxychloride) is used.

The typical gases involved in a $POCl_3$ diffusion process include: an ambient nitrogen gas (main $N_2$ gas), a carrier nitrogen gas (carrier $N_2$ gas) flowed through a bubbler filled with liquid $POCl_3$, a reactive oxygen gas (reactive $O_2$ gas) configured to react with the vaporized $POCl_3$ to form the deposition (processing) gas, and optionally a main oxygen gas (main $O_2$ gas) configured to later form an oxide layer.

In general, a silicon substrate is first placed in a heated tube furnace with the main $N_2$ gas. $POCl_3$ vapor is then flowed into the tube furnace, heated to a deposition temperature, and exposed to reactive $O_2$ gas to form $P_2O_5$ (Phosphorus Oxide) on the silicon substrate, as well as $Cl_2$ (chlorine) gas that interacts with and removes metal impurities in the silicon substrate. $P_2O_5$ in turn reacts with the silicon substrate to form $SiO_2$, and free P atoms. The simultaneous oxidation of the silicon wafer during the deposition results in the formation of a $SiO_2.P_2O_5$ layer (PSG or phosphorous silicate glass).

An additional drive-in step (free of any $POCl_3$ flow) is typically employed using the deposition temperature or a higher temperature in order to enable the free phosphorous atoms to diffuse further into the silicon substrate and substitutionally replace silicon atoms in the lattice in order to be available for charge carrier generation. During this step, a set of drive-in ambient gases which may comprise of main $N_2$ gas and/or main $O_2$ gas is flowed into the tube furnace. The use of oxygen would result in the formation of an oxide layer at the silicon wafer surface. Such an oxide layer attenuates the diffusion of P atoms from the PSG layer into the silicon substrate allowing for more control over the resultant diffusion profiles. In general, for a given temperature phosphorous diffuses slower in $SiO_2$ than in silicon.

Forming a BSF typically involves applying an aluminum paste via screen deposition onto the back of a solar cell, and co-firing it in a belt furnace along with the front side metal contacts. However, substantially difference thermal expansion coefficient between aluminum and the silicon substrate turn may cause significant substrate bow as a result of the firing process.

In the case of a rear-contact solar cell configuration, there are several photolithography and dopant diffusion steps for defining the emitter, back surface field, front surface field, contact cuts, and metal gridlines.

In an advantageous manner, a set of silicon nanoparticle fluids (e.g., ink, paste, etc.) may be deposited on a front surface and a back surface of a silicon substrate, such that a set of dopants are driven into the silicon substrate.

Consequently, both a selective emitter and a boron BSF (in the case of a conventional front-contact solar cell), or a set of rear contacts and a FSF (in the case of a rear contact solar cell), may be formed in a single processing step, each without substantially affecting or contaminating the other.

For example, a conventional front-contact solar cell may be manufactured using a $POCl_3$ process by depositing a first silicon nanoparticle fluid in an pattern on the front surface of a (boron-doped) silicon substrate, and depositing a second counter-doped nanoparticle fluid (i.e., of the same dopant type as that of the substrate—typically boron) on the rear substrate surface (and further shielded from the $POCl_3$ by being positioned facing the rear surface of a second substrate).

In the case of a selective emitter, diffused regions are formed that are counter doped to the substrate: a lightly doped region with sheet resistance generally of between about 90 Ohm/sq to about 120 Ohm/sq and a heavily doped region (of the same dopant type) with a sheet resistance may be formed generally between about 30 Ohm/sq to about 60 Ohm/sq. In the case of a boron BSF, a doped region may be formed with a sheet resistance of between about 10 Ohm/sq to about 200 Ohm/sq as measured on oppositely doped wafer.

Alternatively, a rear-contact solar cell may also be manufactured using a $POCl_3$ process on an n-type wafer. A first silicon nanoparticle fluid (i.e. phosphorous) and a second counter-doped silicon nanoparticle fluid (i.e., of the same dopant type as that of the substrate—typically boron) may be deposited on the rear substrate surface (and shielded from the $POCl_3$). Consequently, the set of inter-digitated rear contacts is simultaneously formed with a phosphorous-doped FSF.

A silicon nanoparticle fluid (or colloidal dispersion) as previously described is a type of homogenous mixture consisting of two separate phases: a continuous phase (such as a solvent), and a dispersed phase (generally nanoparticles).

Nanoparticles are generally microscopic particle with at least one dimension less than 100 nm. In comparison to a bulk material (>100 nm) which tends to have constant physical properties regardless of its size (e.g., melting temperature, boiling temperature, density, conductivity, etc.), nanoparticles may have physical properties that are size dependent, such as a lower sintering temperature or a wider band gap. Like pigment in paint, these nanoparticles must be temporarily suspended in a colloidal dispersion that may be later deposited on a substrate.

Nanoparticles may be produced by a variety of techniques such as evaporation (S. Ijima, Jap. J. Appl. Phys. 26, 357 (1987)), gas phase pyrolysis (K. A Littau, P. J. Szajowski, A. J. Muller, A. R. Kortan, L. E. Brus, J. Phys. Chem. 97, 1224 (1993)), gas phase photolysis (J. M. Jasinski and F. K. LeGoues, Chem. Mater. 3, 989 (1991);), electrochemical etching (V. Petrova-Koch et al., Appl. Phys. Lett. 61, 943 (1992)), plasma decomposition of silanes and polysilanes (H. Takagi et al, Appl. Phys. Lett. 56, 2379 (1990)), high pressure liquid phase reduction-oxidation reaction (J. R. Heath, Science 258, 1131 (1992)), etc.

In addition, nanoparticles may be doped using techniques as described by U.S. patent application Ser. No. 12/113,451, entitled Methods And Apparatus For The Production of Group IV Nanoparticles in a Flow-Through Plasma Reactor, and filed May 1, 2008, and U.S. patent application Ser. No. 11/842,466, entitled In Situ Doping of Group IV Semiconductor Nanoparticles and Thin Films Formed Therefrom, and filed Aug. 21, 2007, both incorporated by reference.

Furthermore, since surface of the silicon nanoparticle may be incompatible with the continuous phase of the silicon nanoparticle fluid, organic capping methods are generally used to functionalize the surface. In a first method, H-passivated surfaces may be treated via Grignard chemistry routes. In another method, H-passivated surfaces may be reacted with alcohols and aldehydes. In yet another method, conjugated bonds of terminal alkenes and alkynes may be inserted between Group IV atom and Hydrogen atom. See J. M. Buriak. "Organometallic Chemistry on Silicon and Germanium Surfaces" *Chemical Reviews* 102.5 (2002):1272-1308. In the case of H-passivated Si surfaces, such reaction is known as hydrosilylation.

A process for the formation of a selective emitter based on silicon nanoparticles is described in U.S. Patent No. 61/222,628, filed on Jul. 2, 2009, and entitled Methods of Using A Silicon Nanoparticle Ink to Control In Situ A Phosphorous Diffusion Profile, and which is incorporated by reference.

Referring now to FIG. 1, a simplified diagram of a solar cell with a selective emitter and blanket BSF. In a common configuration, an n++ diffused region 114 and n− diffused region 108 are first formed on a p− (lightly doped) silicon substrate 110. Prior to the deposition of $SiN_x$ layer 104 on the front of the substrate, residual PSG formed on the substrate surface during the phosphorous deposition process (i.e., $POCl_3$) is substantially removed, commonly by exposing the $SiO_2$ to BOE.

Front-metal contact 102 and back surface field (BSF)/back metal contact 116 are then generally formed on silicon substrate 110. Front-metal contact 102 is generally formed from an Ag paste comprising Ag powder (about 70 at % to about 80 at %), lead borosilicate glass $PbO$—$B_2O_3$—$SiO_2$ (1 to 10 at %), and organic components (15 about to 30 about at %). BSF/back metal contact 116 is generally configured to create an electrical field that repels and thus minimize the impact of minority carrier rear surface recombination. In addition, Ag pads [not shown] are generally applied onto BSF/back metal contract 116 in order to facilitate soldering for interconnection into modules.

Figure 2:
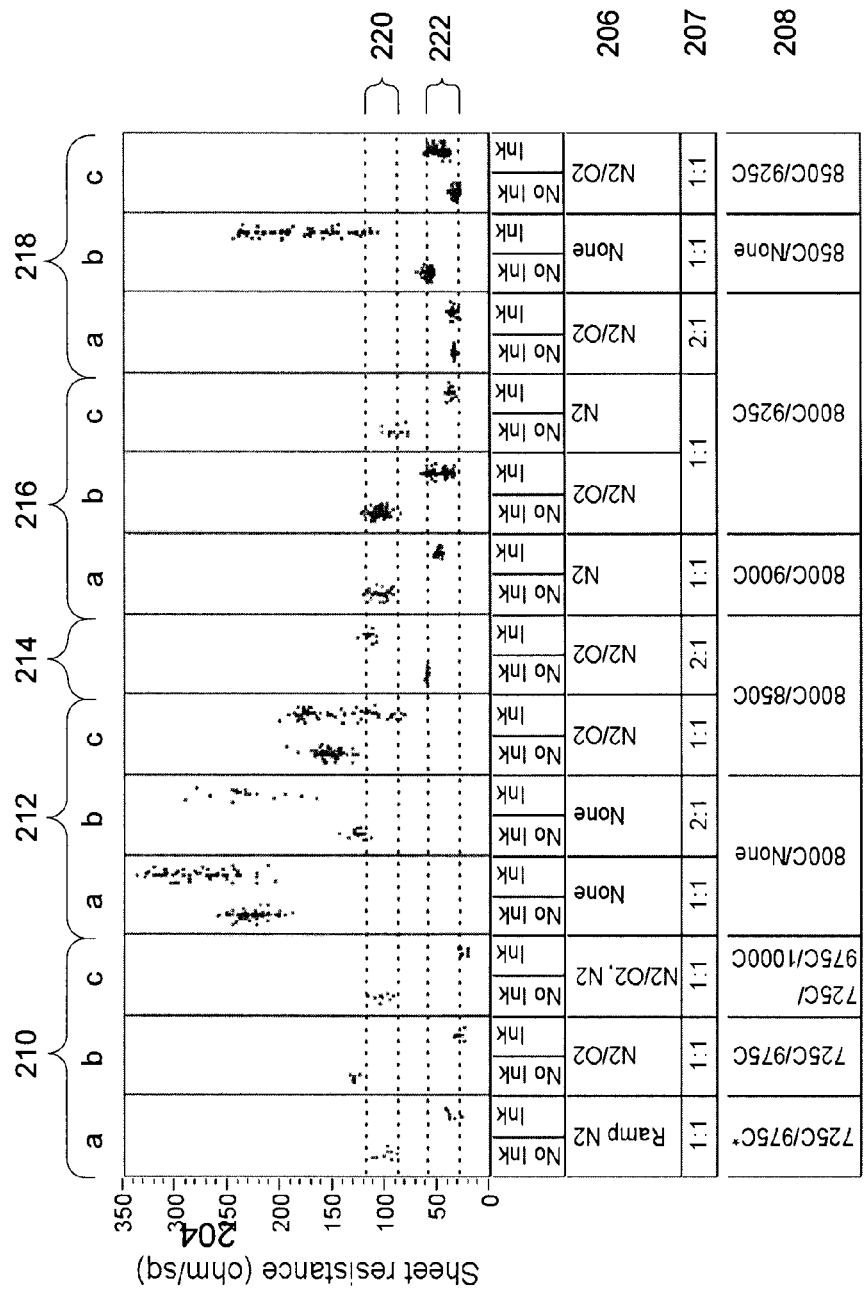
FIG. 2 shows a simplified diagram of eight sets of crystalline silicon substrates configured with various silicon nanoparticle fluid configurations, in accordance with the invention.

Referring now to FIG. 2 shows a simplified diagram of eight sets of crystalline silicon substrates configured with various silicon nanoparticle fluid configurations, in accordance with the invention. All substrate sets comprised of saw-damage etched p-type silicon substrates, each with a thickness of about 180 um and a bulk resistivity of about 2 Ohm-cm. The substrates were first cleaned with piranha (a mixture of sulfuric acid ($H_2SO_4$) and hydrogen peroxide ($H_2O_2$)). This cleaning was followed by a DI water rinsing step and then a subsequent buffered oxide etch (BOE) dip followed by a final DI water rinse. Substrates were then dried using $N_2$ prior to a silicon nanoparticle fluid (containing silicon nanoparticles with about deposited on one side of the substrates and comprising about 4 at % silicon nanoparticles in a set of organic solvents.

The substrate was then baked at a temperature of 600° C. in a baking ambient in a rapid thermal processing (RTP) tool for a time period of about 3 minutes in order to evaporate solvent molecules and to form a densified film. Although the baking ambient was inert in this experiment, an oxidizing ambient may be used.

In general, all the substrates in set 210 were exposed to a dopant source in a diffusion furnace with a deposition ambient of $POCl_3$, $N_2$, and $O_2$, at temperatures ranging from about 725° C. to about 850° C., and for time periods ranging from about 20 minutes to about 35 minutes, followed by additional drive-in thermal steps in a drive-in ambient ranging up to about 1000° C. for time periods up to about 30 minutes. The entire processes involved time periods ranging from about 50 minutes to about 240 minutes. The residual PSG glass layers on the substrate surface and the densified film surface were subsequently removed by a BOE cleaning step for about 5 minutes.

Substrate subset 210*a* had a drive-in ambient of just nitrogen with a ramp to about 975° C. without any hold time resulting in an average fluid region sheet resistance of about 34.7 ohm/sq and average exposed region sheet resistance of about 99.6 ohm/sq where a fluid region is an area which is covered by the ink. Consequently, a selective emitter may be formed.

Substrate subset 210*b* had a drive-in ambient of main $N_2$ and main $O_2$ in a ratio of about 1:1 for about 15 minutes resulting in an average fluid region sheet resistance of about 30.0 ohm/sq and an average exposed region sheet resistance of about 130.6 ohm/sq. And although the average exposed region sheet resistance that is slightly higher than the preferable range for a lightly doped region (about 90 Ohm/sq to about 120 Ohm/sq), it still may be used to form a selective emitter.

Substrate subset 210*c* had a first drive-in ambient of main $N_2$ and main $O_2$ in a ratio about 1:1 for about 15 minutes, and a second drive-in ambient of just nitrogen for about 30 minutes, and an average fluid region sheet resistance of about 25.7 ohm/sq and an average exposed region sheet resistance of about 103.8 ohm/sq. Consequently, a selective emitter may be formed.

All the substrates in subset 216 had an initial deposition temperature of about 800° C. for about 20 minutes, a carrier $N_2$ to reactive $O_2$ ratio during deposition of about 1:1, and a drive-in temperature of at least about 900° C.

Substrate subset 216a had a drive-in ambient of just main $N_2$ for about 15 minutes resulting in an average fluid region sheet resistance of about 48.8 ohm/sq and an average exposed region sheet resistance of about 105.6 ohm/sq. Consequently, a selective emitter may be formed.

Substrate subset 216b had a drive-in ambient of main $N_2$ and main $O_2$ in a ratio of about 1:1 for about 15 minutes at about 925° C. resulting in an average fluid region sheet resistance of about 49.3 ohm/sq and an average exposed region sheet resistance of about 106.4 ohm/sq. Consequently, a selective emitter may be formed.

Substrate subset 216c had a drive-in ambient of just main $N_2$ for about 15 minutes resulting in an average fluid region sheet resistance of about 48.7 ohm/sq and an average exposed region sheet resistance of about 105.6 ohm/sq. Consequently, a selective emitter may be formed.

In contrast, substrate subsets 212a-c, 214, and 218b had average sheet resistances that are generally too high for an optimal selective emitter configuration. As previously described, a high sheet resistance generally corresponds to a light doping configuration, which tends to minimize recombination but also tends to form a poor ohmic metal contact.

Substrate subset 212a had average fluid region sheet resistance of about 276.9 ohm/sq and an average exposed region sheet resistance of about 227.7 ohm/sq. Substrate subset 212b had average fluid region sheet resistance was about 233.2 ohm/sq and an average exposed region sheet resistance of about 127.5 ohm/sq. Substrate subset 212c had average fluid region sheet resistance was about 147.7 ohm/sq and an average exposed region sheet resistance of about 153.8 ohm/sq.

Substrate set 214 had an initial deposition temperature of about 800° C. for about 20 minutes, a carrier $N_2$ to reactive $O_2$ ratio during deposition of 2:1, and a drive-in temperature of about 850° C. for about 15 minutes in main $N_2$ and main $O_2$.

Substrate subset 218b had average fluid region sheet resistance was about 179.1 ohm/sq and an average exposed region sheet resistance of about 58.2 ohm/sq. Substrate subset 218b had a deposition temperature of about 850° C. and no drive-in step, which is generally insufficient to create an optimal selective emitter dopant diffusion profile.

In contrast, substrate subsets 218a, 218c, had average exposed region sheet resistances that were too low for optimal selective emitter configuration.

Substrate subset 218a had average fluid region sheet resistance was about 35.6 ohm/sq and an average exposed region sheet resistance of about 34.1 ohm/sq. Substrate subset 218c had average fluid region sheet resistance was about 48.7 ohm/sq and an average exposed region sheet resistance of about 31.9 ohm/sq. Both had a deposition temperature of about 850° C. or less and a drive-in temperature of about 925° C., which is also insufficient to create an optimal selective emitter dopant diffusion profile.

Figure 3:
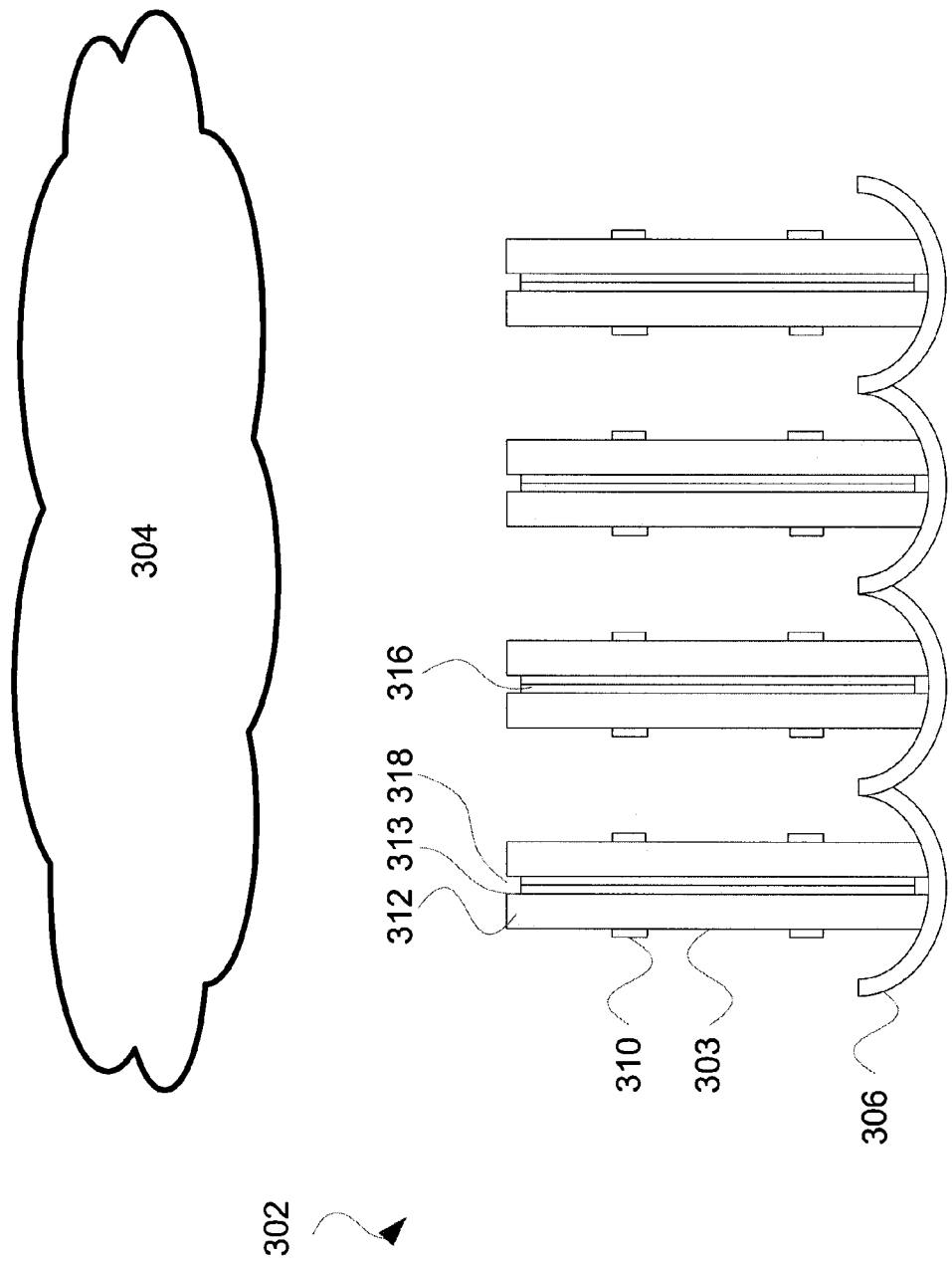
FIG. 3 shows a simplified diagram of a back to back diffusion, in accordance with the invention.

Referring to FIG. 3, a simplified diagram of a conventional front-contact solar cell back to back diffusion is shown, in accordance with the invention. In general, silicon substrates 312 are vertically positioned within a quartz tube in a horizontal diffusion furnace 302. However, unlike common diffusion configurations, in an advantageous manner, substrates 312 are placed back to back (rear substrate surfaces facing each other) within a slot of substrate carrier boat 306. That is, a first set of ink films deposited in 310 on front surface 303 of each substrate 312 would be substantially exposed to ambient gas 304, while a second set of ink films 316 deposited on rear surface 313 of each substrate 312 would be substantially shielded from ambient gas 304. Consequently, if ambient gas 304 includes a dopant source, such as $POCl_3$, a counter doped (second) ink 316 (such as for a BSF) on rear surface 313 would not be exposed to that dopant source. That is, second ink 316 may be used to dope the substrate without interference from the diffusion ambient, resulting in a different diffusion under the ink on the back of the substrate as opposed to the other areas of the sample.

In addition to diffusion of the dopant from the ink into the underlying substrate during the diffusion process, some of the dopant may be transported across the inter-substrate gap 318 and diffuse into the neighboring substrate. In general, a portion of the dopant in the second ink film 313 may become volatile during the heating process (generally above 750° C.). To minimize unintended diffusion strength variations across the wafer, ink-covered areas are generally placed proximate to each other with substantially similar dopant concentrations.

Figure 4:
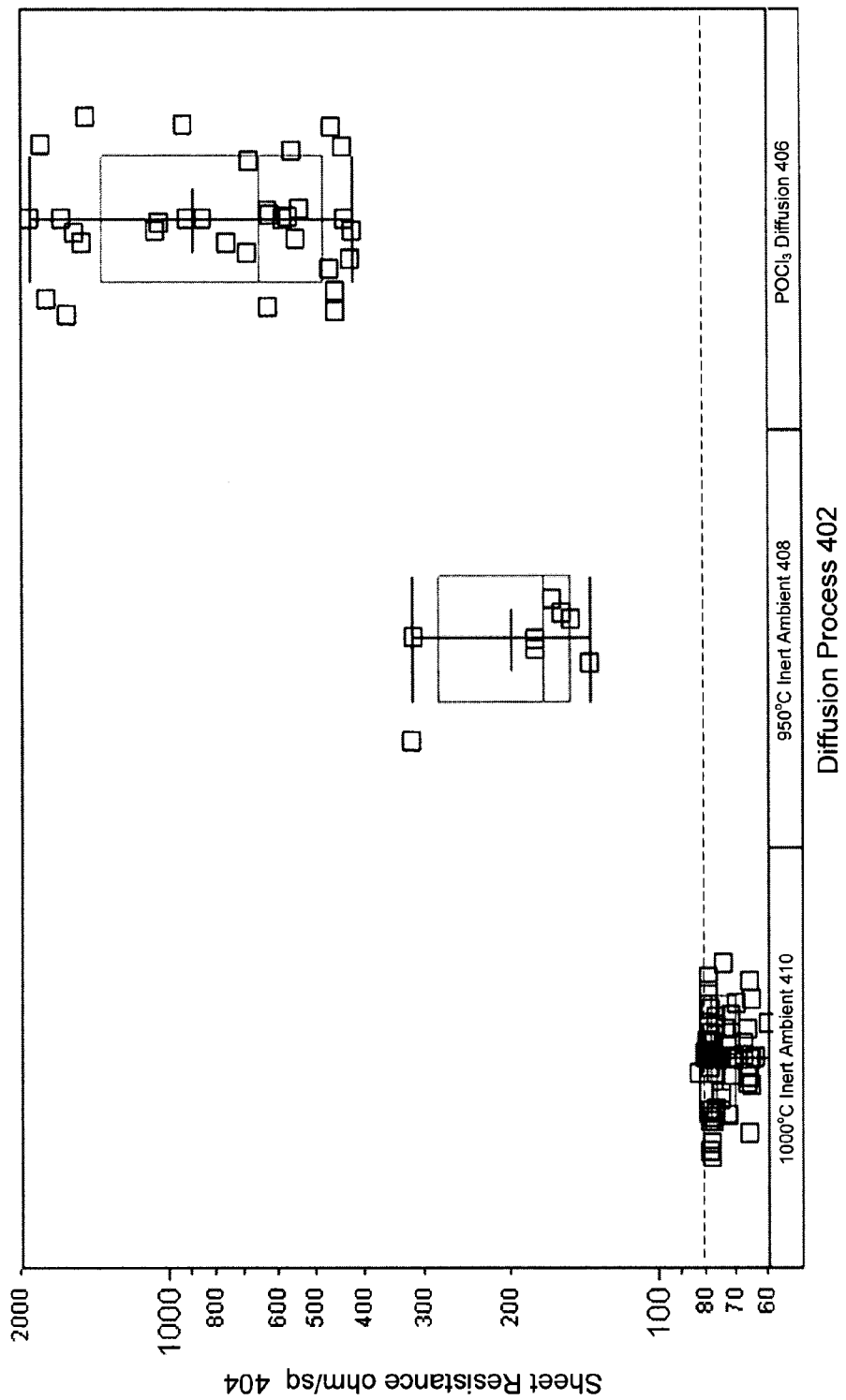
FIG. 4 shows a simplified diagram of three sets of silicon substrates, each exposed to a different silicon ink diffusion process, in accordance with the invention.

Referring to FIG. 4, a simplified diagram is shown of three sets of silicon substrates, each exposed to a different boron doped silicon ink diffusion process, in accordance with the invention. In general, for a BSF process a substantially uniform boron dopant concentration from $10^{19}$ to $5 \times 10^{20}/cm^3$ is beneficial to the creation of a surface field. This boron dopant concentration corresponds to a sheet resistivity of about 10 Ohm/sq to about 100 Ohm/sq on a phosphorous (counter) doped substrate. The measured sheet resistivity for a boron doped layer on an n-type (phosphorous doped) substrate diffused in the back to back configuration is shown on the vertical axis 404 in Ohm/sq, while the diffusion process is shown along the horizontal axis 402.

A first diffusion 406 on a first set of substrates was performed during the $POCl_3$ process as described previously. That is, heating the substrate in a baking ambient to a first temperature of between about 200° C. and about 800° C. and for a first time period of between about 3 minutes and about 20 minutes in order to create a densified boron-doped film of between about 300 nm and about 1 um. Next, exposing the substrate to a dopant source in a diffusion furnace with a deposition ambient, the deposition ambient comprising $POCl_3$, a carrier $N_2$ gas, a main $N_2$ gas, and a reactive $O_2$ gas, wherein a ratio of the carrier $N_2$ gas to the reactive $O_2$ gas is between about 1:1 to about 1.5:1, at a second temperature of between about 700° C. and about 1000° C., and for a second time period of about 5 minutes to about 35 minutes, wherein a PSG layer is formed on the front substrate surface and on the densified film ink pattern. And finally, heating the substrate in a drive-in ambient to a third temperature of between about 800° C. and about 1100° C. Here, a set of sheet resistances were measured with a mean of 800 Ohm/sq, generally too high for a beneficial surface field.

A second diffusion 408 without $POCl_3$ was performed on a second set of substrates. Initially, the second set of substrates was heated in a baking ambient to a first temperature of between about 200° C. and about 800° C. and for a first time period of between about 3 minutes and about 20 minutes in order to create a densified film. Next, the second set of substrates was heated in an inert ambient (here nitrogen) to a second temperature 950° C. and for a second time period about 30 minutes. Here, a set of sheet resistances were measured with a mean of about 200 Ohm/sq, which may form an adequate surface field if the corresponding substrate surface is substantially passivated, for example with a dielectric layer.

That is, the required BSF strength generally depends on the final passivation scheme of the surface. If there is a dielectric passivation (such as an oxide or nitride layer), the BSF dopant concentration and corresponding surface field strength may be reduced as the minority carriers will not tend to recombine at the surface. However, if the surface is metallic (such as with aluminum as previously described) the surface field must generally be substantially strong in order to minimize minority carrier recombination along the silicon metal interface.

Finally, a third diffusion 410 without $POCl_3$ was performed on a third set of substrates. Initially, the third set of substrates was heated in a baking ambient to a first temperature of between about 200° C. and about 800° C. and for a first time period of between about 3 minutes and about 20 minutes in order to create a densified film. Next, the second set of substrates was heated in an inert ambient (here nitrogen) to a second temperature of about 1000° C. and for a second time period about 30 minutes. Unlike the first two diffusions, the set of measured sheet resistances here have a mean of 70 Ohm/sq, which is beneficial to creation of a blanket back surface field.

In an alternate configuration, a process that first runs the third diffusion 410 followed by the first diffusion 406 would also yield a mean of about 70 Ohm/sq, which is beneficial to the creation of a surface field.

Figure 5:
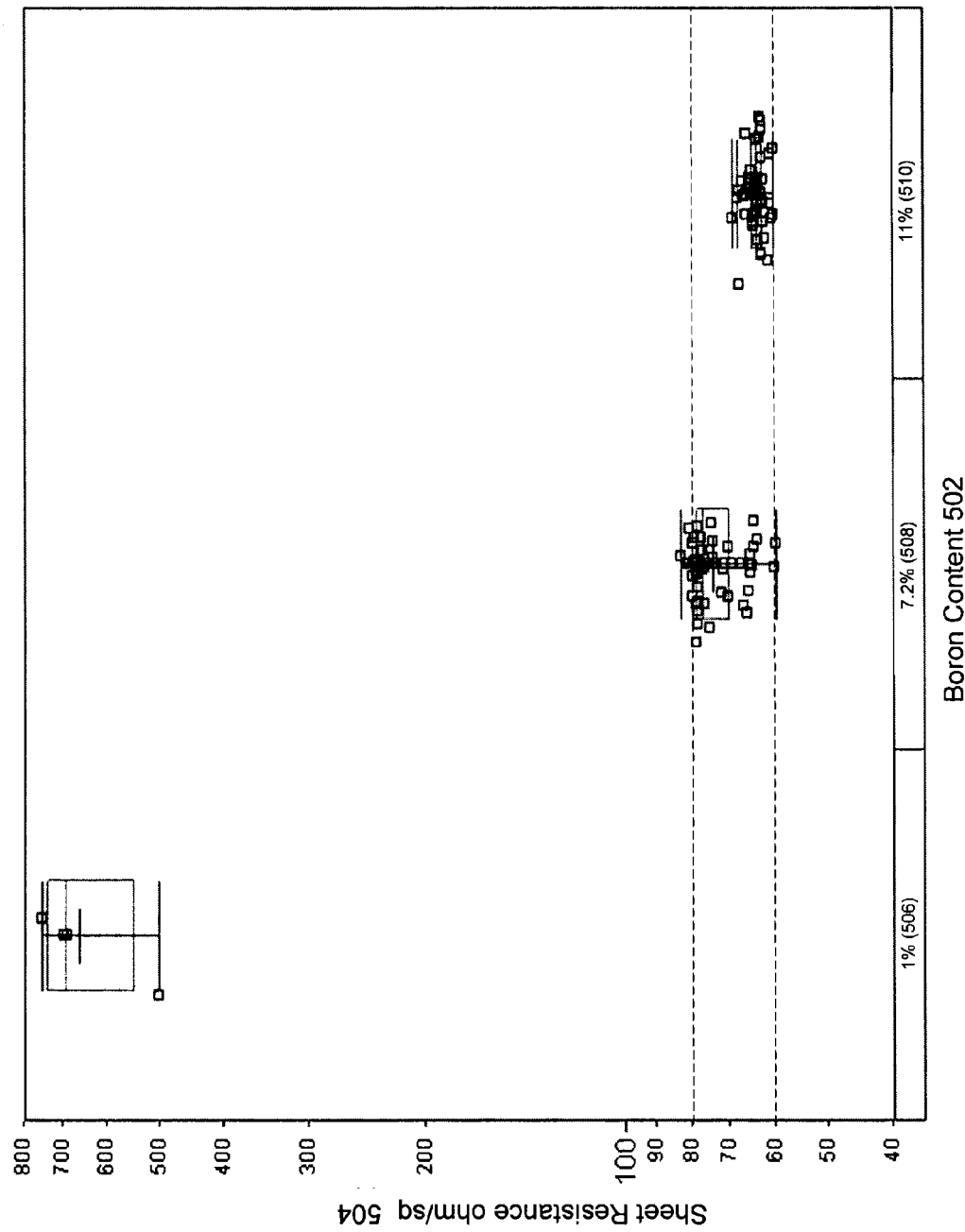
FIG. 5 shows a simplified diagram of three sets of silicon substrates, each exposed to the same silicon ink diffusion process with different silicon ink boron dopant concentrations, in accordance with the invention.

Referring to FIG. 5, a simplified diagram is shown of three sets of silicon substrates, each exposed to the same silicon ink diffusion process with different silicon ink dopant concentrations (as measured during the particle synthesis phase and before suspension in a silicon ink), in accordance with the invention. As in FIG. 4, in order to isolate measurement of the resulting diffusion, the substrate was doped with an n-type dopant (phosphorous) that is counter doped to the dopant in the ink (boron). Here, all diffusions were performed in an inert (nitrogen) ambient at about 1000° C. and for about 30 minutes. Along the horizontal axis is shown the boron content percentage 502, while the vertical axis is shown Sheet Resistance in ohm/sq 504 for the doped area.

The first diffusion 506 included a nanoparticle ink with a boron concentration in relation to silicon of 1 atomic % (as measured during the particle synthesis phase and before suspension in a silicon ink). The resulting set of measured sheet resistances has a mean of 600 Ohm/sq, which may be much too high for a beneficial surface field.

In contrast, the second diffusion 508 and the third diffusion 510 have included a nanoparticle with a boron concentration in relation to silicon of 7.2 atomic % and 11% (as measured during the particle synthesis phase and before suspension in a silicon ink) respectively. The resulting set of measured sheet resistances have a mean of 75 Ohm/sq for 7.2 at % concentration and 65 Ohm/sq for 11 at % boron concentration (as measured during the particle synthesis phase and before suspension in a silicon ink), which are both optimal for a beneficial surface field (for example, in a back-contact solar cell).

Figure 6:
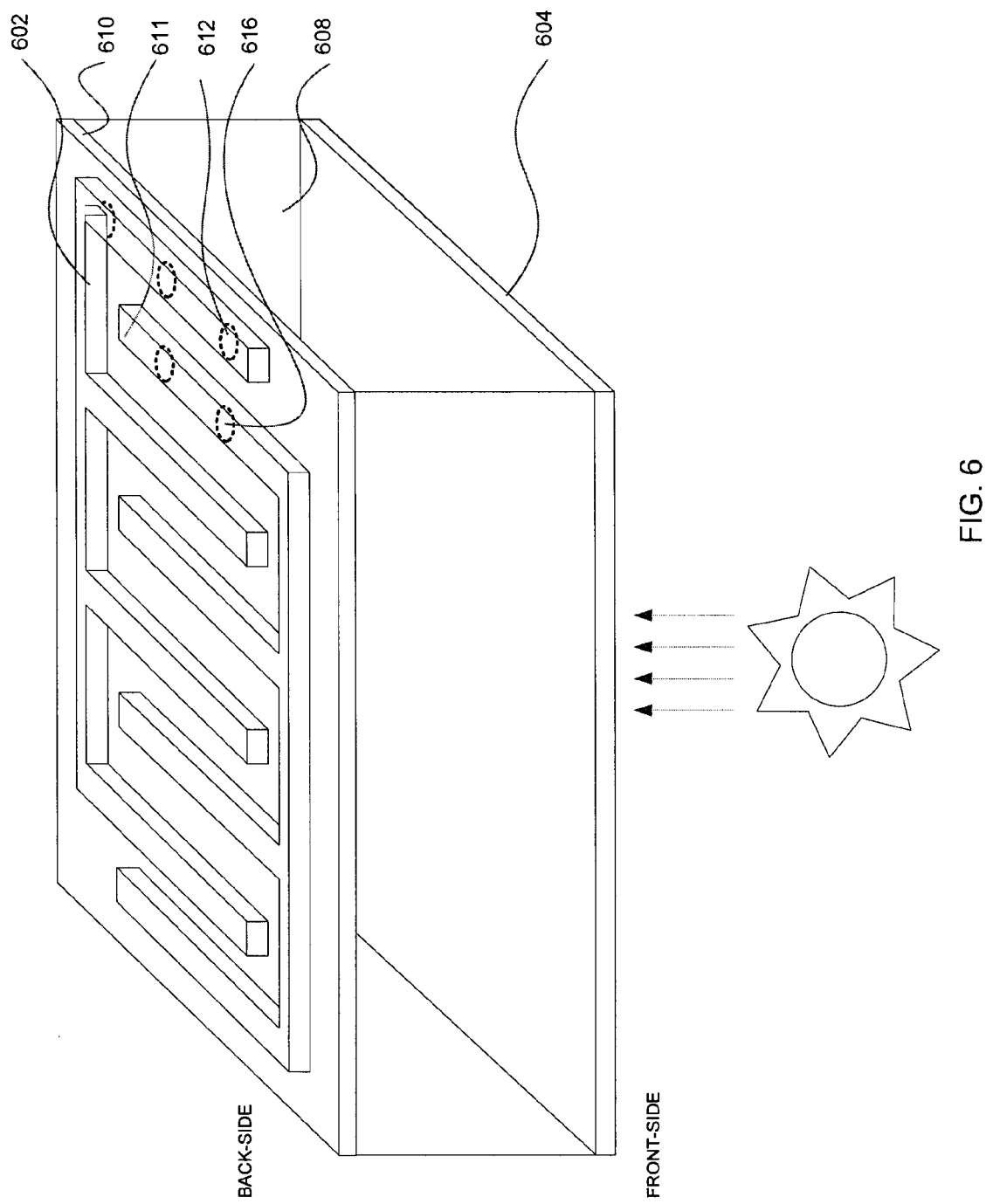
FIG. 6 shows a simplified diagram of a back contact solar cell, in accordance with the invention.

FIG. 6 shows a simplified diagram of a back contact solar cell, in accordance with the invention. As previously described, back-contact solar cells generally have both the emitter and the BSF, and thus the corresponding metal contacts, on the rear of the solar in an inter-digitated configuration. Consequently, front-side shading losses are substantially eliminated which tends to improve overall solar cell efficiency.

In a common configuration, a set of p-type (emitter) regions 612 and a set of n-type base contact regions 616 are diffused into an n-type (phosphorous doped) silicon substrate 608. Optionally, a surface passivation layer 610 of silicon nitride or silicon oxide can be deposited on the back side of the surface. In order to extract the charge carriers, an emitter metal contact 602 is deposited over the set of p-type regions 612, and a base metal contact 611 is deposited over the set of n-type regions 613. In addition, a front-side layer 604 comprising an FSF (front-surface field) and an anti-reflective coating (as previously described) is also deposited.

Figure 7:
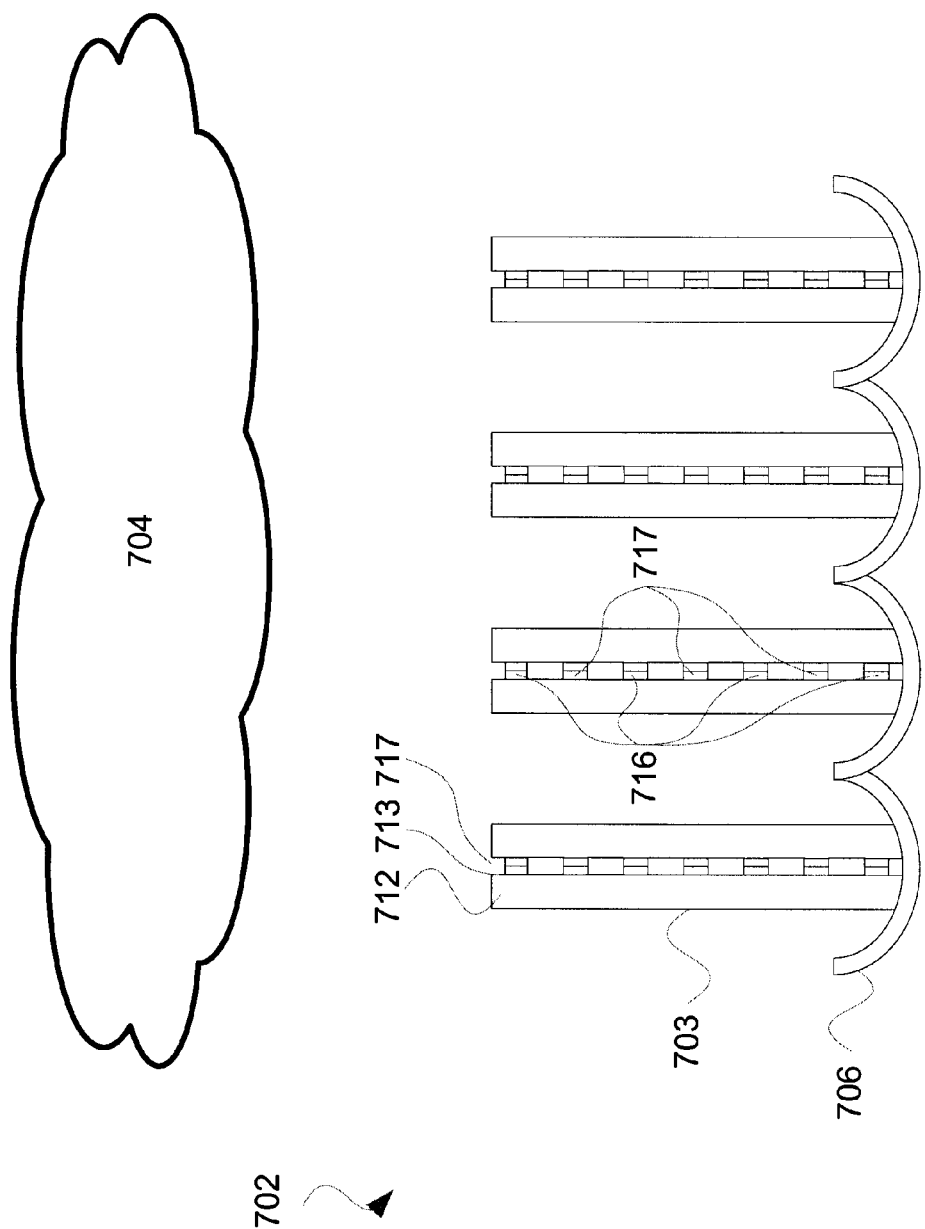
FIG. 7 shows a simplified diagram of a rear contact back to back diffusion, in accordance with the invention.

Referring to FIG. 7, a simplified diagram of a rear contact back to back diffusion is shown, in accordance with the invention. In general, as in FIG. 3, silicon substrates 712 are vertically positioned within a quartz tube in a horizontal diffusion furnace 702. However, unlike common diffusion configurations, in an advantageous manner, substrates 712 are placed back to back (rear substrate surfaces facing each other) within a slot of substrate carrier boat 706. That is, a first set of doped ink films 716 and a second set of counter-doped ink films 717 are deposited in an inter-digitated configuration on rear surface 713 of each substrate set 712, such that each ink film is substantially shielded from ambient gas 704. Consequently, if ambient gas 704 includes a dopant source, such as $POCl_3$, a FSF (front surface field) may be formed in situ along with the set of counter-doped ink films on rear surface.

In addition to diffusion of the dopant from the ink into the underlying substrate during the diffusion process, some of the dopant may be transported across the inter-substrate gap 718 and diffuse into the neighboring substrate. That is, a portion of the dopants in the first set of doped ink films 716 and a second set of counter-doped ink films 717 become volatile during the heating process (generally above 750° C.). To minimize unintended diffusion strength variations across the wafer, same dopant type ink-covered areas are generally placed proximate to each other with substantially similar concentrations.

Figure 8:
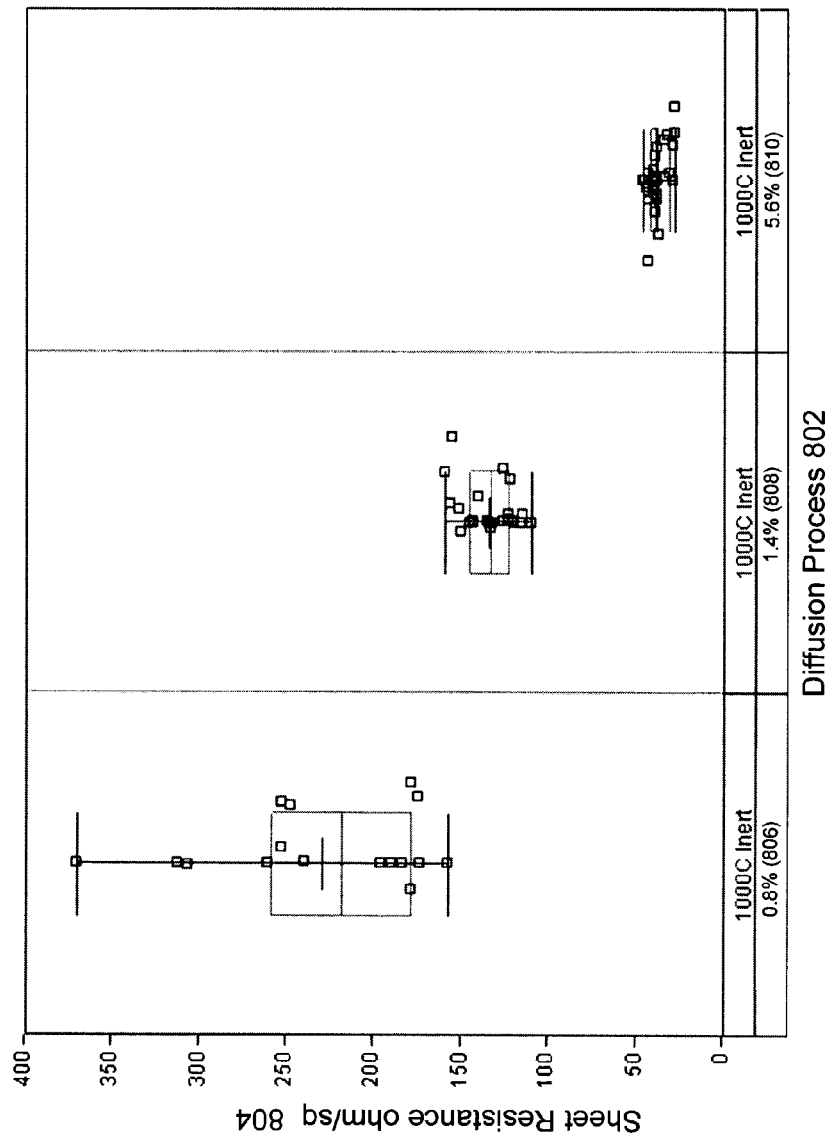
FIG. 8 shows a simplified diagram is shown of three sets of silicon substrates, each exposed to the same silicon ink diffusion process with different silicon ink phosphorous dopant concentrations, in accordance with the invention.

Referring to FIG. 8, a simplified diagram is shown of three sets of silicon substrates, each exposed to the same silicon ink diffusion process with different silicon ink boron dopant concentrations (as measured during the particle synthesis phase and before suspension in a silicon ink), in accordance with the invention. In order to isolate measurement of the resulting diffusion, the substrate was doped with a p-type dopant (boron) that is counter doped to the dopant in the ink (phosphorous). Here, all diffusions were performed in an inert (nitrogen) ambient at about 1000° C. and for about 30 minutes. Along the horizontal axis is shown the boron content percentage 802, while the vertical axis is shown Sheet Resistance in ohm/sq 804 for the doped area.

The first diffusion 806 and the second diffusion 808 have included a nanoparticle with a phosphorous concentration in relation to silicon of 0.8 atomic % and 1.4% (as measured during the particle synthesis phase and before suspension in a silicon ink) respectively. The resulting set of measured sheet resistances have a mean of 230 Ohm/sq for 0.8 at % concentration and 130 Ohm/sq for 1.4 at % phosphorous concentration (as measured during the particle synthesis phase and before suspension in a silicon ink), which are both much too high to form a low resistance metal contact in a rear contact solar cell.

In contrast, the third diffusion 810 has an optimal sheet resistance for an ohmic metal contact. Here, diffusion 810 included a nanoparticle ink with a phosphorous concentration in relation to silicon of 5.6 atomic % (as measured during the particle synthesis phase and before suspension in a silicon ink). The resulting set of measured sheet resistances has a mean of 40 Ohm/sq.

Figure 9A:
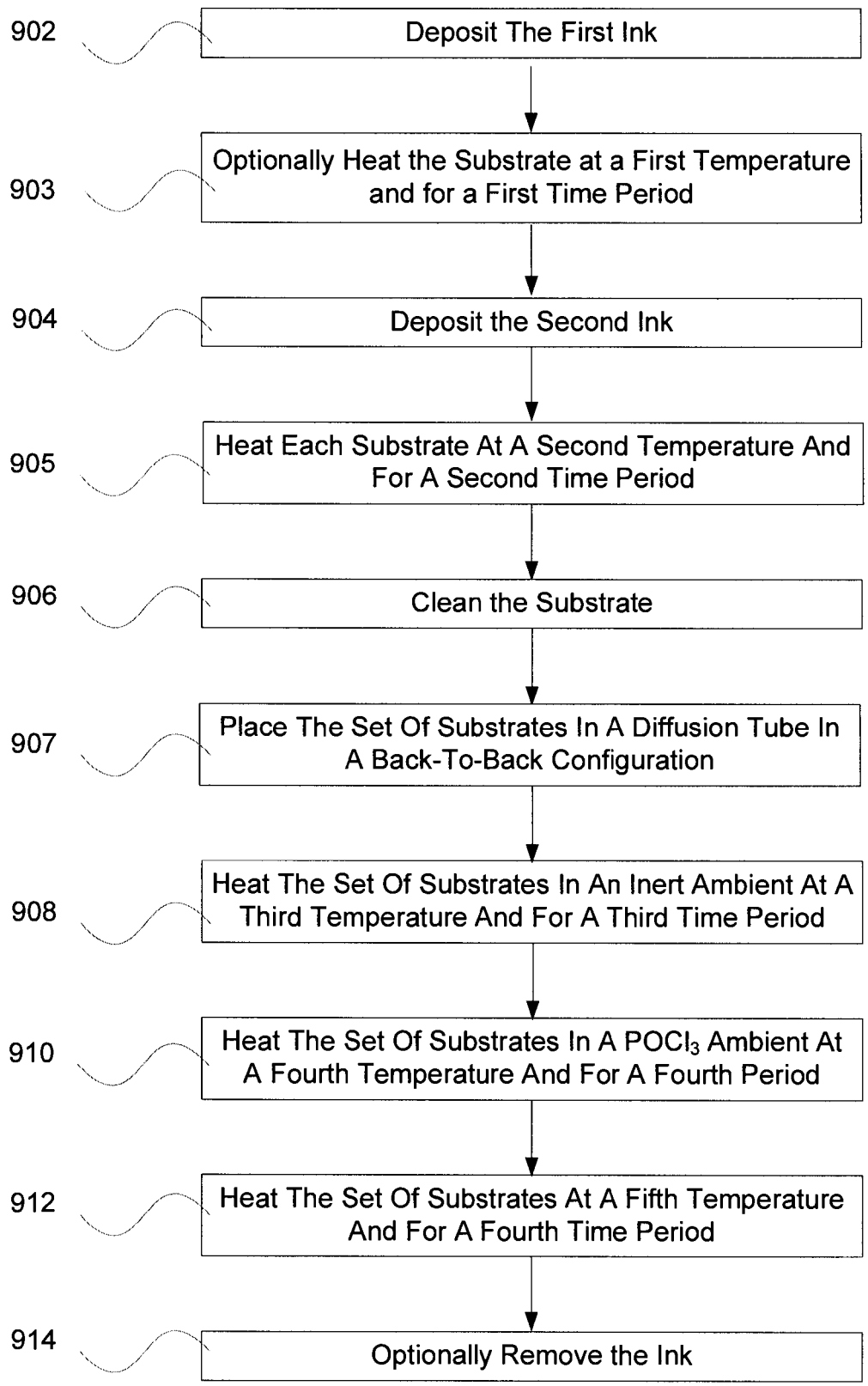
FIG. 9A shows a simplified method of forming a selective emitter and a boron BSF on set of p-type solar cell substrates, in accordance with the invention.

Referring to FIG. 9A, a simplified method of forming a selective emitter and a boron BSF on set of p-type solar cell substrates, in accordance with the invention.

Initially at step 902, a first ink is deposited on a first surface (front or rear) of each substrate. If the first surface is the rear of the solar cell substrate, the first ink is doped with boron.

Optionally at step 903, the substrate is baked in order to remove the set of solvents from the first ink and to densify the deposited ink into a film with a thickness from about 100 nm to about 1000 nm. This may be done in a first temperature of between about 200° C. and about 800° C. and for a first time period of between about 3 minutes and about 20 minutes.

Next at step 904, the second ink is deposited on a second (opposite) surface of each substrate. If the second surface is the rear of the solar cell substrate, the second ink is doped with boron.

Next at step 905, each substrate is baked in order to remove the set of solvents from the second ink (and the first ink if not already baked) and to densify the deposited ink(s) into a film with a thickness from about 100 nm to about 1000 nm. This may be done in a second temperature of between about 200° C. and about 800° C. and for a second time period of between about 3 minutes and about 20 minutes.

Optionally at step 906, each substrate is cleaned in a chemical bath to remove unwanted impurities and oxidized parts of the silicon film. Examples of chemicals used at this step include, but are not limited to, at least one of hydrofluoric acid (HF), buffered oxide etchant (BOE), mixture of hydrogen peroxide and sulfuric acid, mixture of hydrogen peroxide, ammonium hydroxide and water At step 907, the set of substrates is placed in a back to back configuration in a diffusion tube, such that the boron containing ink regions (which will enable formation the BSF) are facing each other and are not exposed to the $POCl_3$ ambient.

Next at step 908, the set of substrates is heated in order to drive dopants into the rear surface deposited ink into the substrate. This may be done preferably with a third temperature of between about 875° C. and about 1050° C., more preferable between about, 950° C. and about 1025° C., and most preferably at about 1000° C. The third time period should be preferable between about 1 minute to about 60 minutes, more preferably between about 1 minute to about 40 minutes, and most preferably about 30 minutes. In addition, the dopant concentration (as measured during the particle synthesis phase and before suspension in a silicon ink) should be preferably about 5 at % to about 15 at %, more preferably between about 7 at % and about 13 at %, and most preferably about 11 at %.

Next at step 910, the set of substrates is heated in a $POCl_3$ ambient. Here, the substrate is exposed to a dopant source in a diffusion furnace with a deposition ambient, the deposition ambient comprising $POCl_3$, a carrier $N_2$ gas, a main $N_2$ gas, and a reactive $O_2$ gas, wherein a ratio of the carrier $N_2$ gas to the reactive $O_2$ gas is between about 1:1 to about 1.5:1, at a fourth temperature of between about 700° C. and about 1000° C., and for a fourth time period of about 5 minutes to about 35 minutes, wherein a PSG layer is formed on the front substrate surface.

Next at step 912, the set of substrates is again heated in an inert or an oxidizing ambient. That is, the substrate is heated in a drive-in ambient to a fifth temperature of between about 800° C. and about 1100° C., in order to drive in both the phosphorous (from the PSG) and the boron (from the densified ink) dopants.

Finally, at step 914, the ink is optionally removed from each substrate by a suitable means, commonly with an HF solution.

Figure 9B:
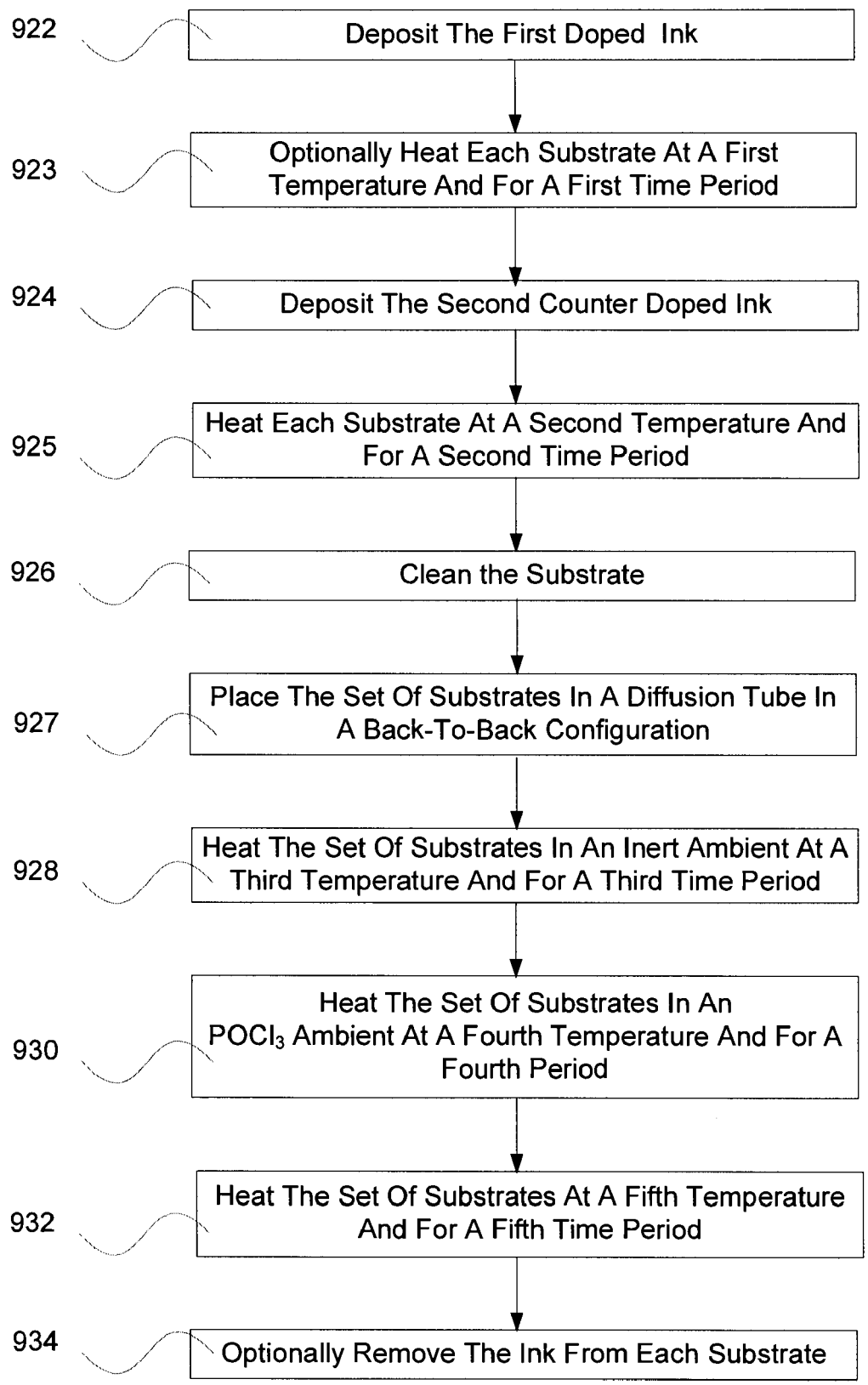
FIG. 9B shows a simplified method of forming a back contact solar cell on a set of p-type substrates, in accordance with the invention.

Referring to FIG. 9B, a simplified method of forming a back contact solar cell on a set of doped silicon substrates, in accordance with the invention. In the case of a solar cell with a selective emitter, a set of phosphorous doped regions are formed on a boron doped substrate with a boron doped BSF. In the case of a typical solar cell with a set of back-contacts, a set of inter-digitated counter doped regions are formed on a phosphorous doped substrate with a phosphorous doped BSF. Alternatively, a boron doped substrate with a boron doped BSF can also be used in this configuration.

Initially at step 922, a first doped ink is deposited on a surface of each substrate.

Optionally at step 923, each substrate is baked in order to remove the set of solvents from the ink and densify the deposited ink into a film with a thickness from about 100 nm to about 1000 nm. This may be done in a first temperature of between about 200° C. and about 800° C. and for a first time period of between about 3 minutes and about 20 minutes.

Next at step 924, a second counter-doped ink is deposited on the same surface of each substrate as the first doped ink in an inter-digitated pattern, as previously described.

Next at step 925, each substrate is baked in order to remove the set of solvents from the ink and densify the deposited ink into a film with a thickness from about 100 nm to about 1000 nm. This may be done in a second temperature of between about 200° C. and about 800° C. and for a second time period of between about 3 minutes and about 20 minutes.

Optionally at step 926, each substrate is cleaned in a chemical bath to remove unwanted impurities and oxidized parts of the silicon film. Examples of chemicals used at this step include, but are not limited to, at least one of hydrofluoric acid (HF), buffered oxide etchant (BOE), mixture of hydrogen peroxide and sulfuric acid, mixture of hydrogen peroxide, ammonium hydroxide and water At step 927, the set of substrates is placed back to back in a diffusion tube, such that comparable dopant types tend to face each other (i.e., regions containing boron face each other, while regions containing phosphorous face each other), subsequently reducing exposure to the $POCl_3$ ambient.

Next at step 928, the set of substrates is heated in order to drive dopants in the rear surface deposited ink into the substrate. This may be done preferably with a third temperature of between about 875° C. and about 1050° C., more preferable between about, 950° C. and about 1025° C., and most preferably at about 1000° C. The third time period should be preferable between about 1 minute to about 60 minutes, more preferably between about 1 minute to about 40 minutes, and most preferably about 30 minutes. In addition, the boron dopant concentration (as measured during the particle synthesis phase and before suspension in a silicon ink) should be preferably about 5 at % to about 15 at %, more preferably between about 7 at % and about 13 at %, and most preferably about 11 at %. Phosphorus dopant concentration (as measured during the particle synthesis phase and before suspension in a silicon ink) should be preferably about 1 at % to about 10 at %, more preferably between about 3 at % and about 6 at %, and most preferably about 5 at %.

Next at step 930, the set of substrates is heated in a $POCl_3$ ambient. Here, the substrate is exposed to a dopant source in a diffusion furnace with a deposition ambient, the deposition ambient comprising $POCl_3$, a carrier $N_2$ gas, a main $N_2$ gas, and a reactive $O_2$ gas, wherein a ratio of the carrier $N_2$ gas to the reactive $O_2$ gas is between about 1:1 to about 1.5:1, at a fourth temperature of between about 700° C. and about 1000° C., and for a fourth time period of about 5 minutes to about 35 minutes, wherein a PSG layer is formed on the front substrate surface and on the densified film ink pattern.

Next at step 932, the set of substrates is again heated in an inert or an oxidizing ambient. That is, the substrate is heated in a drive-in ambient to a fifth temperature of between about 800° C. and about 1100° C., in order to drive in both the phosphorous and the boron dopants.

The inventions illustratively described herein may suitably be practiced in the absence of any element or elements, limitation or limitations, not specifically disclosed herein. Thus, for example, the terms "comprising," "including," "containing," etc. shall be read expansively and without limitation. Additionally, the terms and expressions employed herein have been used as terms of description and not of limitation, and there is no intention in the use of such terms and expressions of excluding any equivalents of the features shown and described or portions thereof, but it is recognized that various modifications are possible within the scope of the invention claimed.

Thus, it should be understood that although the present invention has been specifically disclosed by preferred embodiments and optional features, modification, improvement and variation of the inventions herein disclosed may be resorted to by those skilled in the art, and that such modifications, improvements and variations are considered to be within the scope of this invention. The materials, methods, and examples provided here are representative of preferred embodiments, are exemplary, and are not intended as limitations on the scope of the invention.

As will be understood by one skilled in the art, for any and all purposes, particularly in terms of providing a written description, all ranges disclosed herein also encompass any and all possible sub-ranges and combinations of sub-ranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," "greater than," "less than," and the like include the number recited and refer to ranges which can be subsequently broken down into sub-ranges as discussed above. In addition, the terms "dopant or doped" and "counter-dopant or counter-doped" refer to a set of dopants of opposite types. That is, if the dopant is p-type, then the counter-dopant is n-type. Furthermore, unless otherwise dopant-types may be switched. In addition, the term "substrate" may include both mono-crystalline and multi-crystalline substrates.

All publications, patent applications, issued patents, and other documents referred to in this specification are herein incorporated by reference as if each individual publication, patent application, issued patent, or other document were specifically and individually indicated to be incorporated by reference in its entirety. Definitions that are contained in text incorporated by reference are excluded to the extent that they contradict definitions in this disclosure.

For the purposes of this disclosure and unless otherwise specified, "a" or "an" means "one or more." All patents, applications, references and publications cited herein are incorporated by reference in their entirety to the same extent as if they were individually incorporated by reference. In addition, the word set refers to a collection of one or more items or objects.

Advantages of the invention include methods of using a set of silicon nanoparticle fluids to control in situ a set of dopant diffusion profiles. Additional advantages include the production of efficient solar cells.

Having disclosed exemplary embodiments and the best mode, modifications and variations may be made to the disclosed embodiments while remaining within the subject and spirit of the invention as defined by the following claims.

What is claimed is:

1. A method of forming a multi-doped junction, comprising:
   (A) providing a first substrate and a second substrate;
   (B) depositing a first ink on a first surface of each of the first substrate and the second substrate, the first ink comprising a first set of nanoparticles and a first set of solvents, the first set of nanoparticles comprising a first concentration of a first dopant;
   (C) depositing a second ink on a second surface of each of the first substrate and the second substrate, the second ink comprising a second set of nanoparticles and a second set of solvents, the second set of nanoparticles comprising a second concentration of a second dopant;
   (D) placing the first substrate and the second substrate in a back to back configuration;
   (E) heating the first substrate and the second substrate in a first drive-in ambient to a first temperature and for a first time period;
   (F) exposing the first substrate and the second substrate in the back to back configuration to a deposition ambient, the deposition ambient comprising $POCl_3$, a carrier $N_2$ gas, a main $N_2$ gas, and a reactive $O_2$ gas for a second time period; and
   (G) heating the first substrate and the second substrate in a second drive-in ambient to a third temperature for a third time period.

2. The method of forming a multi-doped junction according to claim 1, wherein the first temperature is between about 900° C. and about 1050° C. and the first time period is between about 1 minute to about 60 minutes; wherein a ratio of the carrier $N_2$ gas to the reactive $O_2$ gas is between about 1:1 to about 1.5:1, at a second temperature of between about 700° C. and about 1000° C., and the second time period is about 5 minutes to about 35 minutes and wherein the third temperature is between about 800° C. and about 1100° C.

3. The method of forming a multi-doped junction according to claim 1, wherein when the first or second dopant is boron, the first concentration is between about 5 at % and about 15 at %, and when the first or second dopant is phosphorous, the first concentration is between about 1.4 at % and about 5.6 at %.

4. The method of forming a multi-doped junction according to claim 1, further including the step of
   heating the first substrate and the second substrate in a first baking ambient to a fourth temperature of between about 200° C. and about 800° C. and for a fourth time period of between about 3 minutes and about 20 minutes, wherein the first baking ambient is one of an inert ambient and an oxidizing ambient,
   after said depositing the first ink on the first surface or after said depositing the second ink on the second surface.

5. The method of forming a multi-doped junction according to claim 1, further including the step of cleaning the first substrate and the second substrate in a wet chemical bath prior to said placing the first substrate and the second substrate in a the back to back configuration.

6. The method of forming a multi-doped junction according to claim 1, wherein the first temperature is between about 975° C. and about 1025° C., and the first time period is between about 1 minute and about 40 minutes, the second temperature is between about 725° C. and about 825° C., and the second time period is between about 10 minutes and about 35 minutes and the third temperature is between about 850° C. and about 1050° C.

7. The method of forming a multi-doped junction according to claim 1, wherein the third time period is between about 15 minutes and about 30 minutes.

8. The method of forming a multi-doped junction according to claim 1, wherein the first drive-in ambient is one of an inert ambient and an oxidizing ambient, and the second drive-in ambient is one of the inert ambient and the oxidizing ambient.

9. The method of forming a multi-doped junction according to claim 1, wherein a) the first ink is doped with boron and the second ink is intrinsic or b) the second ink is doped with boron and the first ink is intrinsic.

10. A method of forming a set of counter-doped regions, comprising:
   (A) providing a first substrate and a second substrate;
   (B) depositing a first ink and a second ink on a first surface of the first substrate and a second surface of the second substrate, the first ink comprising a set of boron-doped nanoparticles and a first set of solvents, the second ink comprising a set of phosphorous-doped nanoparticles and a second set of solvents;
   (C) placing the first substrate and the second substrate inside a diffusion tube wherein the first surface is facing the second surface;
   (D) heating the first substrate and the second substrate in a first drive-in ambient to a first temperature and for a first time period;
   (E) exposing the first substrate and the second substrate to a dopant source in a diffusion furnace with a deposition ambient, the deposition ambient comprising $POCl_3$, a carrier $N_2$ gas, a main $N_2$ gas, and a reactive $O_2$ gas-at a second and for a second time period; and
   (F) heating the first substrate and the second substrate in a second drive-in ambient to a third temperature and for a third time period.

11. The method of forming a set of counter-doped regions according to claim 10, wherein the set of boron-doped nanoparticles comprise between about 5 at % and about 15 at % of boron, and the set of phosphorous-doped nanoparticles comprise between about 1.4 at % and about 5.6 at % of phosphorous.

12. The method of forming a set of counter-doped regions according to claim 10, wherein the first temperature is between about 900° C. and about 1050° C., and the first time period is between about 1 minute to about 60 minutes, wherein a ratio of the carrier $N_2$ gas to the reactive $O_2$ gas is between about 1:1 and about 1.5:1, the second temperature is between about 700° C. and about 1000° C., and the second time period is between about 5 minutes to about 35 minutes and wherein the third temperature is between about 800° C. and about 1100° C.

13. The method of forming a set of counter-doped regions according to claim 10, further including the step of
   heating the first substrate and the second substrate in a first baking ambient to a fourth temperature of between about 200° C. and about 800° C. and for a fourth time period of between about 3 minutes and about 20 minutes, wherein the first baking ambient is one of an inert ambient and an oxidizing ambient,
   after depositing the first ink and the second ink on the first surface of the first substrate and the second surface of the second substrate or between depositing the first ink and depositing the second ink.

14. The method of forming a set of counter-doped regions according to claim 10, further including the step of cleaning the first substrate and the second substrate in a wet chemical bath prior to placing the substrate in the diffusion tube.

15. The method of forming a set of counter-doped regions according to claim 10, wherein the first temperature is between about 975° C. and about 1025° C., and the first time period is between about 1 minute and about 40 minutes, the second temperature is between about 725° C. and about 825° C., and the second time period is between about 10 minutes and about 35 minutes and wherein the third temperature is between about 850° C. and about 1050° C.

16. The method of forming a set of counter-doped regions according to claim 10, wherein the third time period is between about 15 minutes and about 30 minutes.

17. The method of forming a set of counter-doped regions according to claim 10, wherein at least one of the first drive-in ambient and the second dime drive in ambient is one of an inert ambient and an oxidizing ambient.

18. The method of forming a set of counter-doped regions according to claim 10, wherein the first ink includes a boron dopant and the second ink includes a phosphorous dopant.

* * * * *